United States Patent
Adachi et al.

(10) Patent No.: US 11,611,030 B2
(45) Date of Patent: Mar. 21, 2023

(54) THERMOELECTRIC MATERIAL ELEMENT, POWER GENERATION DEVICE, OPTICAL SENSOR, AND METHOD FOR MANUFACTURING THERMOELECTRIC MATERIAL

(71) Applicants: SUMITOMO ELECTRIC INDUSTRIES, LTD., Osaka (JP); TOYOTA SCHOOL FOUNDATION, Nagoya (JP)

(72) Inventors: Masahiro Adachi, Osaka (JP); Makoto Kiyama, Osaka (JP); Takashi Matsuura, Osaka (JP); Yoshiyuki Yamamoto, Osaka (JP); Do-Gyun Byeon, Nagoya (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 189 days.

(21) Appl. No.: 16/977,666

(22) PCT Filed: Feb. 15, 2019

(86) PCT No.: PCT/JP2019/005647
§ 371 (c)(1),
(2) Date: Sep. 2, 2020

(87) PCT Pub. No.: WO2019/171915
PCT Pub. Date: Sep. 12, 2019

(65) Prior Publication Data
US 2020/0403136 A1    Dec. 24, 2020

(30) Foreign Application Priority Data

Mar. 8, 2018   (JP) .............................. JP2018-042280

(51) Int. Cl.
*H01L 35/34* (2006.01)
*H01L 35/26* (2006.01)
*H01L 35/16* (2006.01)

(52) U.S. Cl.
CPC .............. *H01L 35/34* (2013.01); *H01L 35/26* (2013.01); *H01L 35/16* (2013.01)

(58) Field of Classification Search
None
See application file for complete search history.

(56) References Cited

U.S. PATENT DOCUMENTS 5,900,071 A * 5/1999 Harman ................. H01L 35/16
136/238
2006/0005873 A1   1/2006 Kambe et al.
(Continued)

FOREIGN PATENT DOCUMENTS

JP    2006-049872 A    2/2006
JP    2015-135939 A    7/2015
(Continued)

OTHER PUBLICATIONS

Hiroaki Takiguchi et al., "Nano Structural and Thermoelectric Properties of SiGeAu Thin Films", Japanese Journal of Applied Physics, 2011, 50, 041301.
(Continued)

*Primary Examiner* — Evren Seven
(74) *Attorney, Agent, or Firm* — Oliff PLC

(57) ABSTRACT

A thermoelectric material element includes: a thermoelectric material portion composed of a thermoelectric material that includes a first crystal phase and a second crystal phase during an operation, the second crystal phase being different from the first crystal phase; a first electrode disposed in contact with the thermoelectric material portion; and a second electrode disposed in contact with the thermoelectric
(Continued)

material portion and disposed to be separated from the first electrode. During the operation, the thermoelectric material portion includes a first temperature region having a first temperature, and a second temperature region having a second temperature lower than the first temperature of the first temperature region. A ratio of the first crystal phase to the second crystal phase in the first temperature region is larger than a ratio of the first crystal phase to the second crystal phase in the second temperature region.

19 Claims, 9 Drawing Sheets

(56) References Cited

U.S. PATENT DOCUMENTS

| | | | | |
|---|---|---|---|---|
| 2012/0090656 | A1* | 4/2012 | Snyder | H01L 35/16 |
| | | | | 252/514 |
| 2013/0234375 | A1 | 9/2013 | Ren et al. | |
| 2015/0333242 | A1* | 11/2015 | Levy | F03G 7/00 |
| | | | | 136/200 |
| 2016/0049568 | A1 | 2/2016 | Kanatzidis et al. | |
| 2016/0059313 | A1* | 3/2016 | Tang | C22C 12/00 |
| | | | | 419/33 |
| 2016/0099396 | A1* | 4/2016 | Lee | C01B 19/007 |
| | | | | 252/519.13 |
| 2016/0126439 | A1 | 5/2016 | Shi et al. | |
| 2016/0172568 | A1 | 6/2016 | Ko et al. | |
| 2016/0300994 | A1 | 10/2016 | Adachi et al. | |
| 2020/0152849 | A1* | 5/2020 | He | H01L 35/12 |

FOREIGN PATENT DOCUMENTS

| | | | |
|---|---|---|---|
| JP | 2016-506287 A | 3/2016 | |
| JP | 2016-526302 A | 9/2016 | |
| JP | 2016-534562 A | 11/2016 | |
| JP | 2017-084987 A | 5/2017 | |
| KR | 10-2017-0116884 A | 10/2017 | |
| WO | WO-9416465 A1 * | 7/1994 | H01L 35/16 |

OTHER PUBLICATIONS

Huili Liu et al., "Ultrahigh Thermoelectric Performance by Electron and Phonon Critical Scattering in Cu2Se1-xIx", Advanced Materials, 2013, 25, p. 6607-6612.

Bin Zhong et al., "High superionic conduction arising from aligned large lamellae and large figure of merit in bulk Cu1.94Al0.02Se", Applied Physics Letter, 2014, 105, 123902.

Xiao Xing-Xing et al., "Phase transition and high temperature thermoelectric properties of copper selenide Cu2xSE", Chinese Physics B, 2011, vol. 20, No. 8, pp. 087201-1 to 087201-8.

Min Jin et al., "Growth and characterization of large size undoped p-type SnSe single crystal by Horizontal Bridgmam method", Journal of Alloys and Compounds, Apr. 14, 2017, vol. 712, pp. 857-862.

* cited by examiner

THERMOELECTRIC MATERIAL ELEMENT, POWER GENERATION DEVICE, OPTICAL SENSOR, AND METHOD FOR MANUFACTURING THERMOELECTRIC MATERIAL

TECHNICAL FIELD

The present disclosure relates to a thermoelectric material element, a power generation device, an optical sensor, and a method for manufacturing a thermoelectric material. The present application claims a priority based on Japanese Patent Application No. 2018-042280 filed on Mar. 8, 2018, the entire content of which is incorporated herein by reference.

BACKGROUND ART

In recent years, renewable energy has been drawing attention as clean energy to replace a fossil fuel such as petroleum. Such renewable energy include: electric power generated using solar light, hydraulic power, and wind power; and electric power generated by thermoelectric conversion using a temperature difference. In the thermoelectric conversion, heat is directly converted into electric power. Hence, an unnecessary waste is not discharged during the conversion. Moreover, because the thermoelectric conversion requires no driving unit such as a motor, the thermoelectric conversion has a characteristic to facilitate maintenance of devices.

Efficiency $\eta$ in converting a temperature difference (heat energy) into electric energy using a material (thermoelectric conversion material) for thermoelectric conversion is given by the following formula (1):

$$\eta = \Delta T / T_h \cdot (M-1)/(M+T_c/T_h) \tag{1}$$

where $\eta$ represents conversion efficiency, $\Delta T = T_h - T_c$, $T_h$ represents a temperature on the high temperature side, $T_c$ represents a temperature on the low temperature side, $M = (1+ZT)^{1/2}$, $ZT = \alpha^2 ST/\kappa$, ZT represents a dimensionless figure of merit, $\alpha$ represents a Seebeck coefficient, S represents an electric conductivity, and $\kappa$ represents a thermal conductivity. Thus, the conversion efficiency is a monotonously increasing function of ZT. It is important to increase ZT in developing a thermoelectric conversion material.

Here, a technique has been reported in which SiGe (silicon germanium) nano particles are formed as a thermoelectric material through annealing after layering Si, Ge, and Au (for example, Non-Patent Literature 1).

CITATION LIST

Non Patent Literature

NPL 1: Japanese Journal of Applied Physics 50 (2011) 041301

SUMMARY OF INVENTION

A thermoelectric material element according to the present disclosure includes: a thermoelectric material portion composed of a thermoelectric material that includes a first crystal phase and a second crystal phase during an operation, the second crystal phase being different from the first crystal phase; a first electrode disposed in contact with the thermoelectric material portion; and a second electrode disposed in contact with the thermoelectric material portion and disposed to be separated from the first electrode. During the operation, the thermoelectric material portion includes a first temperature region having a first temperature, and a second temperature region having a second temperature lower than the first temperature of the first temperature region. A ratio of the first crystal phase to the second crystal phase in the first temperature region is larger than a ratio of the first crystal phase to the second crystal phase in the second temperature region.

DETAILED DESCRIPTION

Figure 1:
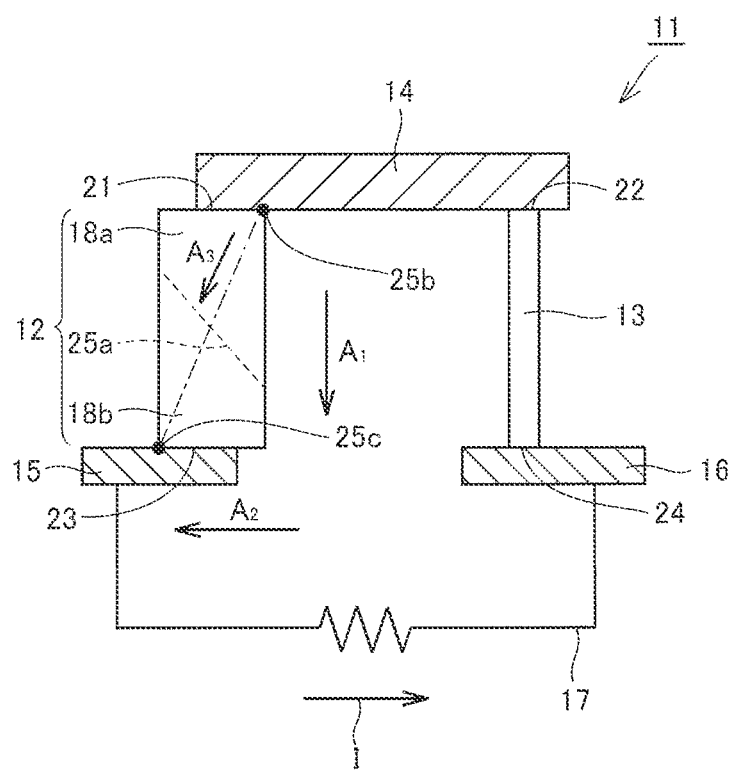
FIG. 1 is a schematic cross sectional view showing an exemplary structure of a thermoelectric material element according to one embodiment of the present application.

Problem to be Solved by the Present Disclosure

Recently, further improvement of efficiency in the thermoelectric conversion employing a temperature difference has been requested. The technique disclosed in Non-Patent Literature 1 above cannot sufficiently satisfies such a request.

In view of this, the present disclosure has one object to provide a thermoelectric material element having improved efficiency in thermoelectric conversion.

Advantageous Effect of the Present Disclosure

According to the above-described thermoelectric material element, the efficiency in thermoelectric conversion can be improved.

Description of Embodiments

First, embodiments of the present disclosure are listed and described. A thermoelectric material element according to the present application includes: a thermoelectric material portion composed of a thermoelectric material that includes a first crystal phase and a second crystal phase during an operation, the second crystal phase being different from the first crystal phase; a first electrode disposed in contact with the thermoelectric material portion; and a second electrode disposed in contact with the thermoelectric material portion and disposed to be separated from the first electrode. During the operation, the thermoelectric material portion includes a first temperature region having a first temperature, and a second temperature region having a second temperature lower than the first temperature of the first temperature region. A ratio of the first crystal phase to the second crystal phase in the first temperature region is larger than a ratio of the first crystal phase to the second crystal phase in the second temperature region.

The thermoelectric material element of the present application includes: the first electrode disposed in contact with the thermoelectric material portion; and the second electrode disposed in contact with the thermoelectric material portion and disposed to be separated from the first electrode. With such a configuration, it is possible to output electric energy obtained by converting a temperature difference, i.e., heat energy through the thermoelectric material portion using the first electrode and the second electrode.

Here, in order to improve efficiency in thermoelectric conversion in the thermoelectric material element, the inventors of the present application have diligently studied to increase ZT, which is a dimensionless figure of merit, with attention being paid to a thermoelectric material for the thermoelectric material element. Moreover, the present inventors have paid attention to the following fact: the thermoelectric material is configured to include the first crystal phase and the second crystal phase during the operation, thus resulting in a high Seebeck coefficient during crystal structure transition, i.e., crystal phase transformation. Accordingly, the thermoelectric material element of the present application has been obtained.

That is, according to the thermoelectric material element of the present application, during the operation, the thermoelectric material portion includes: the first temperature region having the first temperature; and the second temperature region having the second temperature lower than the first temperature of the first temperature region. Moreover, the ratio of the first crystal phase to the second crystal phase in the first temperature region is larger than the ratio of the first crystal phase to the second crystal phase in the second temperature region. In this way, the efficiency in thermoelectric conversion can be increased by employing the high Seebeck coefficient during the crystal phase transformation caused during the operation. Therefore, such a thermoelectric material element can provide improved efficiency in thermoelectric conversion.

In the thermoelectric material element, the first temperature region may include a maximum temperature portion having a highest temperature, the second temperature region may include a minimum temperature portion having a lowest temperature, and the ratio of the first crystal phase to the second crystal phase may become smaller from the maximum temperature portion toward the minimum temperature portion. By configuring in this way, the efficiency in thermoelectric conversion can be improved more securely by employing the high Seebeck coefficient with a wide region being secured for the phase transformation.

In the thermoelectric material element, during the operation, a direction from the maximum temperature portion toward the minimum temperature portion may be inclined relative to a direction from a region at which the first electrode and the thermoelectric material portion are in contact with each other toward a region at which the second electrode and the thermoelectric material portion are in contact with each other. In this way, the region at which the plurality of crystal phases coexist can be secured to be wide, whereby the efficiency in thermoelectric conversion can be improved using the high Seebeck coefficient.

In the thermoelectric material element, in a compound of which the thermoelectric material portion is composed, a ratio of cation atoms included in the first crystal phase may be different from a ratio of cation atoms included in the second crystal phase. In this way, voltage generated between the first electrode and the second electrode becomes high, whereby the efficiency in thermoelectric conversion can be improved. The ratio of the cation atoms in the second crystal phase may be larger than the ratio of the cation atoms in the first crystal phase. Examples of the cation atoms include Cu, Sn, and Ag atoms.

Preferably in the thermoelectric material element, a carrier concentration in the second crystal phase during the operation is lower than a carrier concentration in the second crystal phase before the operation. Due to the phase transformation, two different phases coexist to result in different chemical potentials (Fermi levels), whereby carriers are diffused from the second crystal phase to the first crystal phase. Accordingly, the carrier concentration in the second crystal phase during the phase transformation, i.e., the operation becomes lower than the carrier concentration in the second crystal phase before the phase transformation, i.e., the operation. Accordingly, a high Seebeck coefficient can be obtained. The expression "before the operation" refers to a state with a room temperature (25° C.), for example.

In the thermoelectric material element, at least a portion of a surface of the thermoelectric material portion may be exposed to a reduced pressure. According to such a configuration, heat conduction in the thermoelectric material portion can be suppressed, whereby a temperature difference can be readily formed in the thermoelectric material. Moreover, a composition element of the thermoelectric material is likely to leave, thereby facilitating generation of vacancies. Accordingly, the efficiency in thermoelectric conversion can be improved using the high Seebeck coefficient.

In the thermoelectric material element, at least the portion of the surface of the thermoelectric material portion may be exposed to an atmospheric pressure of less than 10 Pa. With such a thermoelectric material element, the efficiency in thermoelectric conversion can be improved more securely using the high Seebeck coefficient.

Preferably in the thermoelectric material element, during the operation, a temperature difference is less than 2 K between a region at which the first electrode and the thermoelectric material portion are in contact with each other and a region at which the second electrode and the thermoelectric material portion are in contact with each other. In this way, a temperature gradient is made small between the region at which the first electrode and the thermoelectric material portion are in contact with each other and the region at which the second electrode and the thermoelectric material portion are in contact with each other, thereby more facilitating coexistence of the plurality of crystal phases.

Accordingly, the efficiency in thermoelectric conversion can be improved using a higher Seebeck coefficient. It should be noted that the temperature difference is more preferably less than or equal to 1 K.

In the thermoelectric material element, the thermoelectric material portion may be composed of a chalcogenide. With the phase transformation using such a material, the efficiency in thermoelectric conversion can be improved using the high Seebeck coefficient. Moreover, since thermal conductivity is low, the efficiency in thermoelectric conversion can be improved more. Further, since vacancies are likely to be generated in such a material under a reduced pressure, the efficiency in thermoelectric conversion can be improved using a higher Seebeck coefficient.

In the thermoelectric material element, the thermoelectric material portion may be composed of $Cu_2Se$, $SnSe$, $Ag_2Se$, $Ag_2Te$, or a compound obtained by adding a transition metal element to one of the $Cu_2Se$, the $SnSe$, the $Ag_2Se$, the $Ag_2Te$. Since the phase transformation can be employed and the thermal conductivity is low in such a material, the efficiency in thermoelectric conversion can be improved more securely.

In the thermoelectric material element, the thermoelectric material portion may be composed of a compound obtained by adding Ni, Ti, or Zr to the $Cu_2Se$. Moreover, the thermoelectric material portion may be composed of a compound obtained by adding Sc, Ti, or Zr to the SnSe. With the thermoelectric material thus configured, the efficiency in thermoelectric conversion can be improved more securely.

In the thermoelectric material element, the thermoelectric material portion may be composed of $Cu_2Se$, and the thermoelectric material portion may have a temperature falling within a range of 50° C. to 130° C. during the operation. Moreover, in the thermoelectric material element, the thermoelectric material portion may be composed of SnSe, and the thermoelectric material portion may have a temperature falling within a range of 130° C. to 530° C. during the operation. Such a thermoelectric material element can more securely provide improved efficiency in thermoelectric conversion.

In the thermoelectric material element, the first crystal phase may be a cubic or orthorhombic crystal. According to such a configuration, the cubic or orthorhombic crystal having a high degree of symmetry is employed for the first crystal phase included at a high ratio in the first temperature region, whereby the efficiency in thermoelectric conversion can be improved more.

A power generation device according to the present application includes the above-described thermoelectric material element. According to the power generation device of the present application, a power generation device excellent in the efficiency in thermoelectric conversion can be obtained.

An optical sensor according to the present application includes the above-described thermoelectric material element. According to the optical sensor of the present application, the above-described thermoelectric material element having improved efficiency in thermoelectric conversion is employed. As a result, the optical sensor of the present application can have a high sensitivity.

A method for manufacturing a thermoelectric material according to the present application includes: obtaining a pressed powder body by solidifying powder serving as a source material of a chalcogenide; crystallizing a portion of the pressed powder body by heating; and crystallizing a remainder of the pressed powder body by self-heating of the pressed powder body with the heating being halted after crystallizing the portion of the pressed powder body, the self-heating of the pressed powder body resulting from progress of crystallization. According to the method thus configured for manufacturing the thermoelectric material, it is possible to more securely manufacture a thermoelectric material element that can provide improved efficiency in thermoelectric conversion using a high Seebeck coefficient.

Details of Embodiments of the Present Disclosure

Next, the following describes a thermoelectric material element according to one embodiment of the present disclosure with reference to figures. It should be noted that in the below-described figures, the same or corresponding portions are given the same reference characters and are not described repeatedly.

First Embodiment

A first embodiment, which is one embodiment of a thermoelectric material element according to the present application, will be described with reference to FIG. 1 and FIG. 2. It should be noted that in order to facilitate understanding, parts of hatchings each indicating a cross section are omitted in FIG. 1 and FIG. 2.

With reference to FIG. 1 that is a schematic cross sectional view showing an exemplary structure of the thermoelectric material element according to one embodiment of the present application, a thermoelectric material element 11 according to one embodiment of the present application is a so-called I type (uni-leg) thermoelectric material element 11. I type thermoelectric material element 11 includes a thermoelectric material portion 12, a metal wire 13, a high temperature side electrode 14, a first low temperature side electrode 15, a second low temperature side electrode 16, and a wiring 17. Thermoelectric material portion 12 has a rectangular shape in the cross section shown in FIG. 1, and is configured to have a longer size in a direction indicated by an arrow $A_1$ than a size in a direction indicated by an arrow $A_2$.

For thermoelectric material portion 12, a chalcogenide is used, for example. Specifically, thermoelectric material portion 12 is composed of, for example, $Cu_2Se$, $SnSe$, $Ag_2Se$, $Ag_2Te$, or a compound obtained by adding a transition metal element to one of $Cu_2Se$, $SnSe$, $Ag_2Se$, and $Ag_2Te$. More specifically, thermoelectric material portion 12 is composed of a compound obtained by adding Ni, Ti, or Zr to $Cu_2Se$. Further specifically, thermoelectric material portion 12 is composed of a compound obtained by adding Ni to $Cu_2Se$. It should be noted that thermoelectric material portion 12 may be composed of a compound obtained by adding Sc, Ti, or Zr to SnSe.

Metal wire 13 is composed of a material such as Bi, constantan, or Al, for example. Metal wire 13 may be any metal wire as long as it has an electric conductivity, and preferably has a lower thermal conductivity.

The thermoelectric material of which thermoelectric material portion 12 is composed include a first crystal phase and a second crystal phase during an operation, the second crystal phase being different from the first crystal phase. Here, specifically, in the case where heating is performed up to a predetermined temperature in operating I type thermoelectric material element 11, the operation means that the thermoelectric material of which thermoelectric material portion 12 is composed include the first crystal phase and the second crystal phase during the heating up to the predetermined temperature. When thermoelectric material portion 12 is composed of $Cu_2Se$, thermoelectric material portion 12 has a temperature falling within a range of 50° C. to 130° C. during the operation, for example. The first crystal phase is a cubic crystal, for example. The second crystal phase is a monoclinic crystal, for example.

Thermoelectric material portion 12 and metal wire 13 are disposed side by side with a space being interposed therebetween. High temperature side electrode 14 serving as a first electrode is disposed to extend from one end portion 21 of thermoelectric material portion 12 to one end portion 22 of metal wire 13. High temperature side electrode 14 is disposed in contact with both one end portion 21 of thermoelectric material portion 12 and one end portion 22 of metal wire 13. High temperature side electrode 14 is disposed to connect one end portion 21 of thermoelectric material portion 12 to one end portion 22 of metal wire 13. It should be noted that a portion of one end portion 21 of thermoelectric material portion 12, specifically, a portion of end portion 21 on the side on which metal wire 13 is not disposed (i.e., a portion of end portion 21 on a side further away from metal wire 13) is exposed. High temperature side electrode 14 is composed of an electrically conductive material such as a metal. High temperature side electrode 14 makes ohmic contact with thermoelectric material portion 12 and metal wire 13.

First low temperature side electrode 15 serving as a second electrode is disposed in contact with the other end portion 23 of thermoelectric material portion 12. First low temperature side electrode 15 is disposed to be separated from high temperature side electrode 14. It should be noted that a portion of the other end portion 23 of thermoelectric material portion 12, specifically, a portion of end portion 23 on the side on which metal wire 13 is disposed (i.e., a portion of end portion 23 on a side closer to metal wire 13) is exposed. First low temperature side electrode 15 is composed of an electrically conductive material such as a metal. First low temperature side electrode 15 makes ohmic contact with thermoelectric material portion 12.

Figure 2:
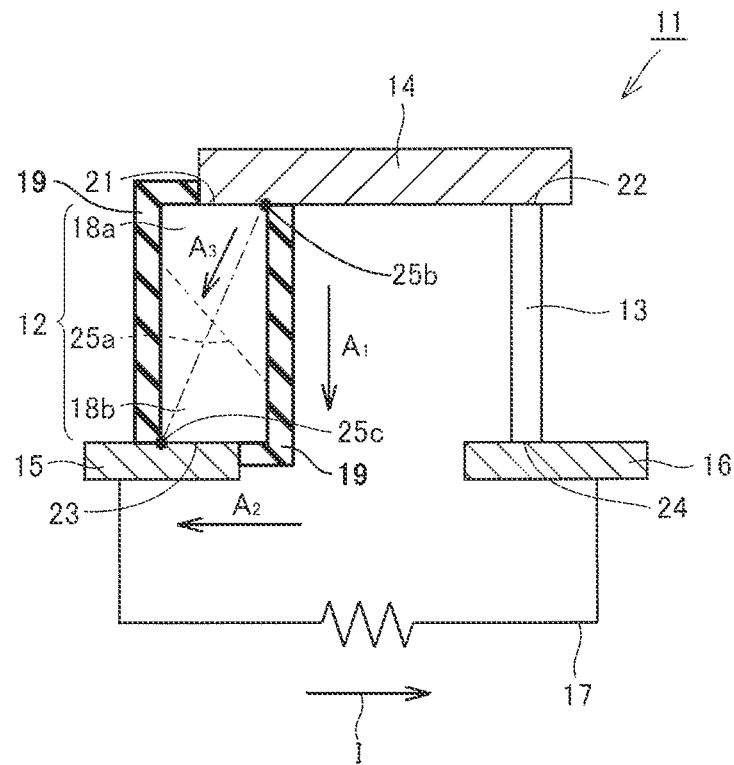
FIG. 2 is a schematic cross sectional view showing another exemplary structure of the thermoelectric material element according to one embodiment of the present application.

With reference to FIG. 2 that is a schematic cross sectional view showing another exemplary structure of the thermoelectric material element according to one embodiment of the present application, at least a portion (i.e., a portion or whole) of a surface of thermoelectric material portion 12 not in contact with high temperature side electrode 14 or first low temperature side electrode 15 in thermoelectric material element 11 according to one embodiment of the present application may be covered with a coating material 19 having a thermal conductivity lower than those of high temperature side electrode 14 and first low temperature side electrode 15. Coating material 19 is not particularly limited as long as it is a material that coats thermoelectric material portion 12 and that has a thermal conductivity lower than those of high temperature side electrode 14 and first low temperature side electrode 15. Silica glass, zirconia, an epoxy resin, or the like is used therefor.

Likewise, second low temperature side electrode 16 serving as the second electrode is disposed in contact with the other end portion 24 of metal wire 13.

Second low temperature side electrode 16 is disposed to be separated from high temperature side electrode 14 and first low temperature side electrode 15. Second low temperature side electrode 16 is composed of an electrically conductive material such as a metal. Second low temperature side electrode 16 makes ohmic contact with metal wire 13.

Wiring 17 is composed of an electrical conductor such as a metal. Wiring 17 electrically connects first low temperature side electrode 15 to second low temperature side electrode 16 via a load (resistor).

Here, during the operation, thermoelectric material portion 12 includes: a first temperature region 18a having a first temperature; and a second temperature region 18b having a second temperature lower than the first temperature of first temperature region 18a. First temperature region 18a is disposed on the high temperature side electrode 14 side. Second temperature region 18b is disposed on the first low temperature side electrode 15 side. It should be noted that in first temperature region 18a, end portion 21 in contact with high temperature side electrode 14 has a portion closest to metal wire 13 and this portion has the highest temperature. That is, first temperature region 18a includes a maximum temperature portion 25b having the highest temperature. Moreover, in second temperature region 18b, end portion 23 in contact with first low temperature side electrode 15 has a portion farthest away from metal wire 13 and this portion has the lowest temperature. That is, second temperature region 18b includes a minimum temperature portion 25c having the lowest temperature. It should be noted that a boundary 25a between first temperature region 18a and second temperature region 18b is roughly indicated by a broken line. Moreover, a line from maximum temperature portion 25b toward minimum temperature portion 25c is indicated by an alternate long and short dash line. A temperature distribution formed in thermoelectric material portion 12 can be measured using a thermo viewer (Thermo Tracer TH9100WB provided by Nippon Avionics), for example.

Moreover, during the operation, a direction from maximum temperature portion 25b toward minimum temperature portion 25c is inclined relative to a direction from end portion 21 that is a region at which high temperature side electrode 14 serving as the first electrode and thermoelectric material portion 12 are in contact with each other toward end portion 23 that is a region at which first low temperature side electrode 15 serving as the second electrode and thermoelectric material portion 12 are in contact with each other. In this case, the direction from maximum temperature portion 25b toward minimum temperature portion 25c is indicated by an arrow $A_3$. It should be noted that when each of end portion 21 and end portion 23 is in surface contact, the direction from end portion 21 toward end portion 23 refers to a direction in which a line connecting end portion 21 to end portion 23 extends with the shortest distance. In this case, the direction from end portion 21 toward end portion 23 corresponds to a direction indicated by arrow $A_1$. It should be noted that in the cross section shown in each of FIG. 1 and FIG. 2, a direction perpendicular to the direction indicated by arrow $A_1$ is indicated by arrow $A_2$.

Here, in thermoelectric material portion 12, a ratio of the first crystal phase to the second crystal phase in first temperature region 18a is larger than a ratio of the first crystal phase to the second crystal phase in second temperature region 18b. That is, during the operation, a ratio of the cubic crystal to the monoclinic crystal in first temperature region 18a is larger than a ratio of the cubic crystal to the monoclinic crystal in second temperature region 18b. Further, the ratio of the first crystal phase to the second crystal phase becomes smaller from maximum temperature portion 25b toward minimum temperature portion 25c. That is, during the operation, the ratio of the cubic crystal to the monoclinic crystal in first temperature region 18a is larger than the ratio of the cubic crystal to the monoclinic crystal in second temperature region 18b. Further, the ratio of the first crystal phase to the second crystal phase becomes smaller from maximum temperature portion 25b toward minimum temperature portion 25c. The ratio of these crystal phases can be measured through, for example, a temperature-variable X-ray diffraction measurement (for example, measurement employing a beamline BL2S1 of the Aichi Synchrotron Radiation Center) with a stage temperature being changed.

In I type thermoelectric material element 11 shown in each of FIG. 1 and FIG. 2, when a temperature difference is formed to attain, for example, a high temperature on the side of each of one end portion 21 of thermoelectric material portion 12 and one end portion 22 of metal wire 13 and a low temperature on the side of each of the other end portion 23 of thermoelectric material portion 12 and the other end portion 24 of metal wire 13, carriers (positive holes in the case of p type, for example) are moved from the one end portion 21 side toward the other end portion 23 side in thermoelectric material portion 12. On this occasion, a different type of carriers (for example, electrons) are moved from the one end portion 22 side toward the other end portion 24 side in metal wire 13. As a result, current flows into wiring 17 in a direction of arrow I. In this way, by using high temperature side electrode 14 serving as the first electrode as well as first low temperature side electrode 15 and second low temperature side electrode 16 each serving as the second electrode in I type thermoelectric material element 11, it is possible to output electric energy obtained by converting the temperature difference, i.e., heat energy using thermoelectric material portion 12 and metal wire 13. That is, in I type thermoelectric material element 11, power generation by the thermoelectric conversion using the temperature difference is attained. In this case, I type thermoelectric material element 11 serves as a power generation device.

Here, in thermoelectric material portion 12, the ratio of the cubic crystal serving as the first crystal phase to the monoclinic crystal serving as the second crystal phase in first temperature region 18a is larger than the ratio of the cubic crystal serving as the first crystal phase to the monoclinic crystal serving as the second crystal phase in second temperature region 18b. In such a thermoelectric material portion 12, the thermoelectric efficiency can be improved using a high Seebeck coefficient during crystal structure transition, i.e., crystal phase transformation. Therefore, I type thermoelectric material element 11 including thermoelectric material portion 12 and metal wire 13 each configured as described above can provide improved efficiency in thermoelectric conversion.

In this case, in thermoelectric material portion 12, first temperature region 18a includes end portion 21 including maximum temperature portion 25b having the highest temperature, second temperature region 18b includes end portion 23 including minimum temperature portion 25c having the lowest temperature, and the ratio of the first crystal phase to the second crystal phase becomes smaller from maximum temperature portion 25b toward minimum temperature portion 25c. Therefore, the efficiency in thermoelectric conversion can be improved more securely by employing a high Seebeck coefficient with a wide region being secured for the phase transformation in thermoelectric material portion 12.

Moreover, in this case, during the operation, the direction from maximum temperature portion 25b toward minimum temperature portion 25c is inclined relative to the direction from end portion 21 that is a region at which high temperature side electrode 14 serving as the first electrode and thermoelectric material portion 12 are in contact with each other toward end portion 23 that is a region at which first low temperature side electrode 15 serving as the second electrode and thermoelectric material portion 12 are in contact with each other. Hence, the region in which the plurality of crystal phases coexist can be readily secured to be wide. That is, in thermoelectric material portion 12, as indicated by boundary 25a, a temperature gradient is formed not only in the direction that is indicated by $A_1$ and that is the long axis direction of thermoelectric material portion 12 but also in the direction that is indicated by $A_2$ and that is the short axis direction. In the case of thermoelectric material portion 12 having the shape shown in each of FIG. 1 and FIG. 2, the length of boundary 25a can be secured to be long due to the formed two-axis temperature gradient. Therefore, the efficiency in thermoelectric conversion can be improved using the high Seebeck coefficient.

In the above-described embodiment, it has been illustrated that thermoelectric material portion 12 is composed of a thermoelectric material and metal wire 13 is composed of a metal; however, they are not limited thereto. Depending on a polarity of thermoelectric material portion 12, metal wire 13 may be configured as an n type thermoelectric material portion or a p type thermoelectric material portion, for example.

Moreover, in the above-described embodiment, thermoelectric material element 11 may be a thermoelectric material element having a different structure, such as a π type thermoelectric material element with a pair of p type and n type, for example.

It should be noted that in the above-described embodiment, thermoelectric material portion 12 is composed of $Cu_2Se$, and has a temperature falling within a range of 50° C. to 130° C. during the operation; however, it is not limited thereto. For example, thermoelectric material portion 12 may be composed of SnSe and may have a temperature falling within a range of 130° C. to 530° C. during the operation. Such a thermoelectric material element 11 can more securely provide improved efficiency in thermoelectric conversion. Further, a relation among the thermoelectric material of which thermoelectric material portion 12 is composed, the first crystal phase, the second crystal phase, the transition temperature, i.e., phase transformation temperature, and a use temperature range may be as shown in Table 1.

TABLE 1

| Material | First Crystal Phase | Space Group/No. | Second Crystal Phase | Space Group/No. | Transition Temperature (° C.) | Use Temperature Range (° C.) |
|---|---|---|---|---|---|---|
| $Cu_2Se$ | Cubic Crystal | Fm-3m/225 | Monoclinic Crystal | Cm/8 | 130 | 50 to 130 |
| SnSe | Orthorhombic Crystal | Cmcm/63 | Orthorhombic Crystal | Pnma/62 | 531 | 130 to 530 |
| $Ag_2Se$ | Cubic Crystal | Im-3m/229 | Orthorhombic Crystal | P2_1 2_1 2_1/19 | 130 | 50 to 130 |
| $Ag_2Te$ | Cubic Crystal | Fm-3m/225 | Monoclinic Crystal | P2_1/c/14 | 145 | 60 to 150 |
| $Cu_2S$ | Cubic Crystal | Fm-3m/225 | Monoclinic Crystal | P2_1/c/14 | 104 | 20 to 110 |
| | | | Hexagonal Crystal | P6_3/mmc/194 | | |

TABLE 1-continued

| Material | First Crystal Phase | Space Group/No. | Second Crystal Phase | Space Group/No. | Transition Temperature (° C.) | Use Temperature Range (° C.) |
|---|---|---|---|---|---|---|
| $Cu_2Te$ | Cubic Crystal | F-43m/216 | Tetragonal Crystal | P4/nmm/129 | 574 (362) | 260 to 580 |
| SnS | Orthorhombic Crystal | Cmcm/63 | Orthorhombic Crystal | Pnma/62 | 600 | 500 to 600 |
| $Ag_2S$ | Cubic Crystal | Im-3m/229 | Monoclinic Crystal | P2_1/c/14 | 178 | 100 to 180 |

It should be noted that in I type thermoelectric material element 11, at least a portion of the surface of thermoelectric material portion 12 may be configured to be exposed to a reduced pressure. Specifically, for example, I type thermoelectric material element 11 may be installed in a region under a pressure of less than or equal to 100 Pa, preferably, less than or equal to $10^{-1}$ Pa, for example, $1\times10^{-2}$ to $1\times10^{-4}$ Pa. According to such a configuration, a composition element of the thermoelectric material is likely to leave, thereby facilitating generation of vacancies. In this way, the efficiency in thermoelectric conversion can be improved using a higher Seebeck coefficient.

For the environment to which the surface of thermoelectric material portion 12 is exposed, an environment under a reduced pressure is advantageous in terms of heat insulation, and is suitable because the above-described two-axis temperature gradient is readily formed in the material. Therefore, such an environment is suitable in facilitating realization of coexistence of the two phases, i.e., the high temperature phase and the low temperature phase. This will be described later.

Here, the following describes details of the thermoelectric material portion included in I type thermoelectric material element 11 described above.

First, a method for measuring a Seebeck coefficient α will be described. Seebeck coefficient α is given by $\alpha=\Delta V/\Delta T$ by measuring voltage ΔV generated when a temperature difference ΔT is provided to the material. The Seebeck coefficient is. In this case, a plurality of crystal phases may exist in the material.

Figure 3:
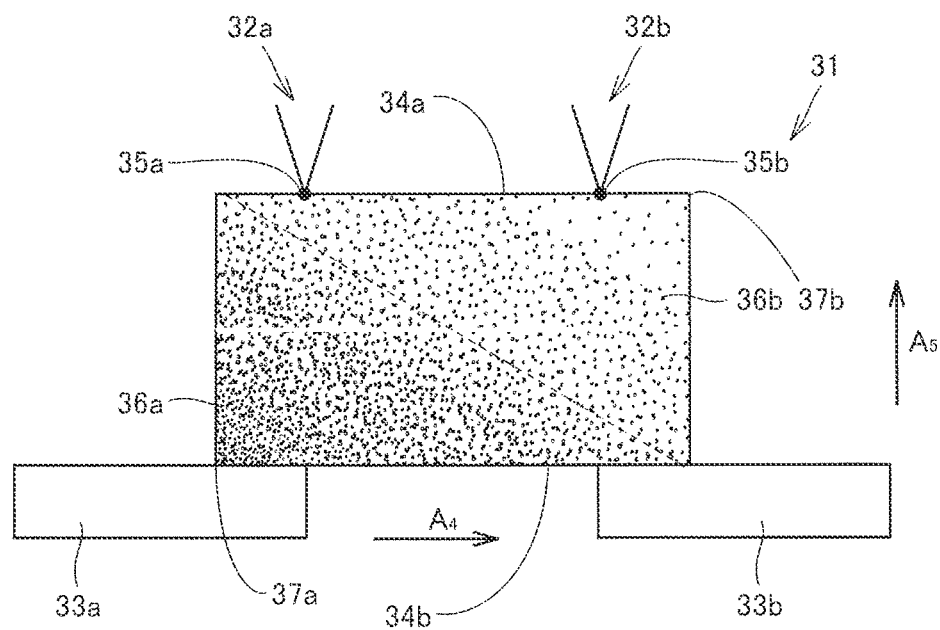
FIG. 3 is a schematic view showing a configuration for measuring a Seebeck coefficient of a thermoelectric material portion.

FIG. 3 is a schematic view showing a configuration for measuring Seebeck coefficient α of the thermoelectric material portion before adjusting a conductivity type. With reference to FIG. 3, for a thermoelectric material of which a thermoelectric material portion 31 is composed, $Cu_2Se$ or a compound obtained by adding Ni to $Cu_2Se$ is used, for example.

A first thermocouple 32a and a second thermocouple 32b are connected to thermoelectric material portion 31. Each of thermocouples 32a, 32b may be of a Pt—PtRh type, for example. Voltage generated between Pt type terminals of these thermocouples 32a, 32b is measured with the Pt type terminals being used as output terminals. That is, thermocouples 32a, 32b are used not only as thermocouples for measuring temperatures but also as output terminals for measuring voltage. A temperature for calculating Seebeck coefficient α is represented by an average value of values from thermocouples 32a, 32b at the surface of thermoelectric material portion 31.

This is also the temperature of an intermediate location between thermocouples 32a, 32b. Likewise, the temperature of thermoelectric material portion 12 in each of FIG. 1 and FIG. 2 indicates the temperature of the surface of the material at an intermediate location between end portion 21 and end portion 23.

A first heater 33a and a second heater 33b are attached to thermoelectric material portion 31. First heater 33a and second heater 33b are attached to a second surface 34b of thermoelectric material portion 31 that is not in contact with a first surface 34a of thermoelectric material portion 31. First heater 33a and second heater 33b are attached to second surface 34b with a space being interposed therebetween.

First thermocouple 32a and second thermocouple 32b are provided in contact with first surface 34a of thermoelectric material portion 31 with a space being interposed therebetween. First thermocouple 32a is attached to a first point 35a located above first heater 33a. Second thermocouple 32b is attached to a second point 35b located above second heater 33b.

Thermoelectric material portion 31 is heated by first heater 33a and second heater 33b. Here, a heating temperature by first heater 33a is configured to be higher than a heating temperature by second heater 33b. Accordingly, the temperature on the side of the region in contact with first heater 33a becomes higher than the temperature on the side of the region in contact with second heater 33b. Moreover, the temperature is decreased from second surface 34b toward first surface 34a. In this case, the temperature of thermoelectric material portion 31 is decreased gradually from second surface 34b toward first surface 34a. It should be noted that a minimum temperature portion 37b in this case is a portion that is located above the region at which thermoelectric material portion 31 and second heater 33b are in contact with each other and that is located on the surface farthest away from first heater 33a. Moreover, a maximum temperature portion 37a in this case is a portion farthest away from minimum temperature portion 37b at the region at which thermoelectric material portion 31 and first heater 33a are in contact with each other. By setting the heating temperature by first heater 33a to be higher than the heating temperature by second heater 33b, a temperature difference, i.e., first temperature region 36a having a higher temperature and second temperature region 36b having a lower temperature, is formed in thermoelectric material portion 31. It should be noted that a degree of highness of the temperature in thermoelectric material portion 31 is represented by the density of dots in FIG. 3. It is indicated that a region with dots located more densely in FIG. 3 is a region having a higher temperature.

In thermoelectric material portion 31, a temperature gradient is formed by first heater 33a and second heater 33b in two axes, i.e., a direction indicated by an arrow $A_4$ and a direction indicated by an arrow $A_5$. Accordingly, the two phases can coexist effectively, whereby a high Seebeck coefficient can be generated.

Here, the temperature difference is preferably less than 2 K and is more preferably less than or equal to 1 K between first point 35a corresponding to the region at which the first electrode and thermoelectric material portion 31 are in contact with each other and second point 35b corresponding to the region at which the second electrode and thermoelectric material portion 31 are in contact with each other. This is because the coexistence of the two phases is attained more readily with a small temperature difference. Accordingly, a high Seebeck coefficient using phase transformation can be generated more effectively.

On the other hand, in the direction of arrow $A_5$, a temperature difference of more than or equal to 30 K, preferably, more than or equal to 40 K may be applied. Accordingly, the two phases can be separated in the direction of arrow $A_5$. Hence, a higher Seebeck coefficient can be generated.

Voltage V between the output terminal of first thermocouple 32a and the output terminal of second thermocouple 32b was measured in a vacuum measurement environment such as an environment in which a space in which thermoelectric material portion 31 is disposed is under a pressure of $1 \times 10^{-2}$ to $1 \times 10^{-4}$ Pa. Seebeck coefficient α was calculated based on measured voltage V and a temperature difference between a measured temperature at first point 35a and a measured temperature at second point 35b.

Figure 4:
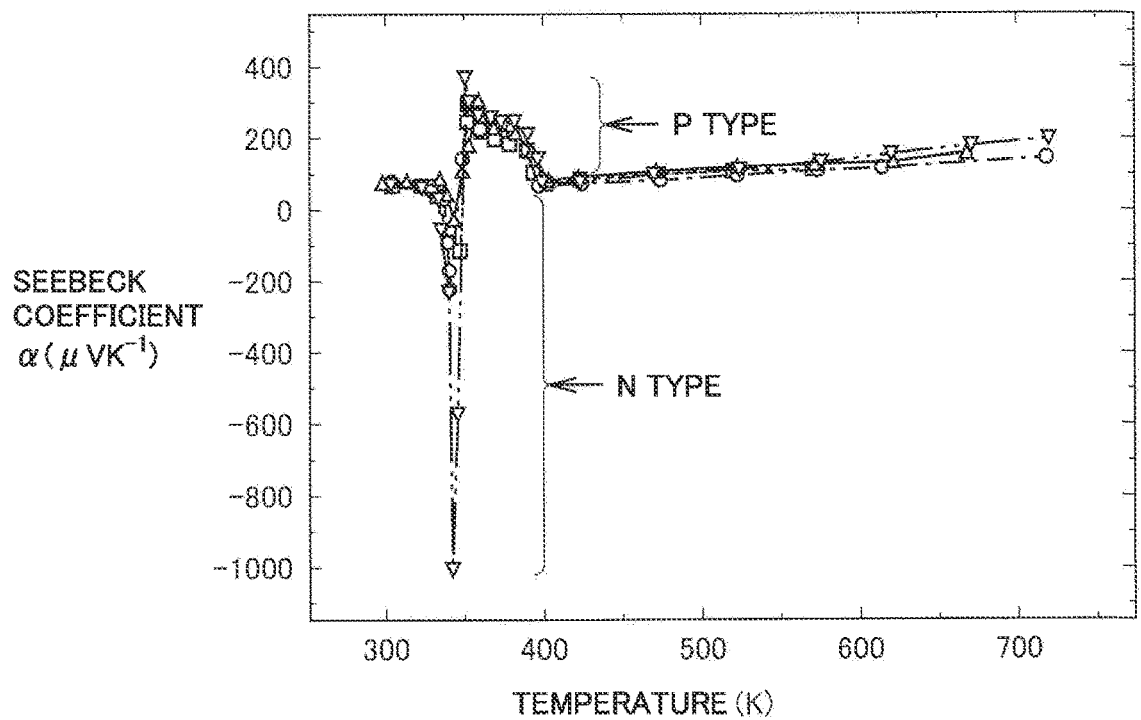
FIG. 4 is a graph showing a relation between the Seebeck coefficient and temperature of the thermoelectric material portion.

FIG. 4 is a graph showing a relation between Seebeck coefficient α and the temperature in thermoelectric material portion 31. In FIG. 4, $Ni_xCu_{1.97-x}Se$ is used as the thermoelectric material and a plot is provided with the value of x being changed variously. Here, Ni is an added element; however, a system in which no Ni is added (x=0.000) is also plotted. In FIG. 4, the vertical axis represents Seebeck coefficient α ($\mu VK^{-1}$), and the horizontal axis represents the temperature (K). In FIG. 4, each quadrangular mark represents a case of x=0 (case of adding no Ni), each white circle mark represents a case of x=0.005, each upward-pointing triangle mark represents a case of x=0.01, and each downward-pointing triangle mark represents a case of x=0.02. It should be noted that in FIG. 4, in the cases of x=0, x=0.005, x=0.01, and x=0.02, tendencies of Seebeck coefficient α at each temperature are the same.

With reference to FIG. 4, when the temperature is increased from about 300 K, Seebeck coefficient α is greatly decreased at about 325 K to 345 K once from a positive value to a negative value. Here, Seebeck coefficient α is significantly decreased to $-1$ $mVK^{-1}$. ZT on this occasion has a maximum value of about 15 when used as an n type thermoelectric material portion. Then, as the temperature is increased, Seebeck coefficient α is greatly increased from a negative value to a positive value. At 350 K to 400 K, the Seebeck coefficient is increased to $+400$ $\mu VK^{-1}$. ZT on this occasion has a maximum value of about 7 when used as a p type thermoelectric material portion. That is, in a relatively low temperature region of about 345 K, a large value of ZT can be obtained when used as an n type thermoelectric material portion and when used as a p type thermoelectric material portion.

It is considered that this behavior originates from phase transformation of the crystal phase of $Cu_2Se$. That is, it is considered that a feature lies in that the two phases, i.e., the low temperature phase and the high temperature phase coexist in the same material. It is considered that at 325 K to 400 K, the two phases, i.e., the low temperature phase and the high temperature phase coexist in this $Cu_2Se$ material, thus resulting in a high Seebeck coefficient in that temperature range.

By measuring respective Cu atom (i.e., cation atom) concentrations in the low temperature phase and the high temperature phase using an electron beam microanalyzer, it can be found that the Cu atom concentrations are different from each other. It is considered that due to such an imbalance of the Cu atoms, voltage between the first electrode and the second electrode becomes high, thus resulting in generation of the high Seebeck coefficient.

When the temperature difference formed in the measurement is less than or equal to 1 K, the Seebeck coefficient becomes high. When the temperature difference formed in the measurement is more than 2 K, the Seebeck coefficient becomes lower than that when the temperature difference formed in the measurement is 1 K. This is presumably because the coexistence of the two phases is attained more readily with a small temperature difference and the high Seebeck coefficient using phase transformation can be accordingly generated more effectively.

Figure 5:
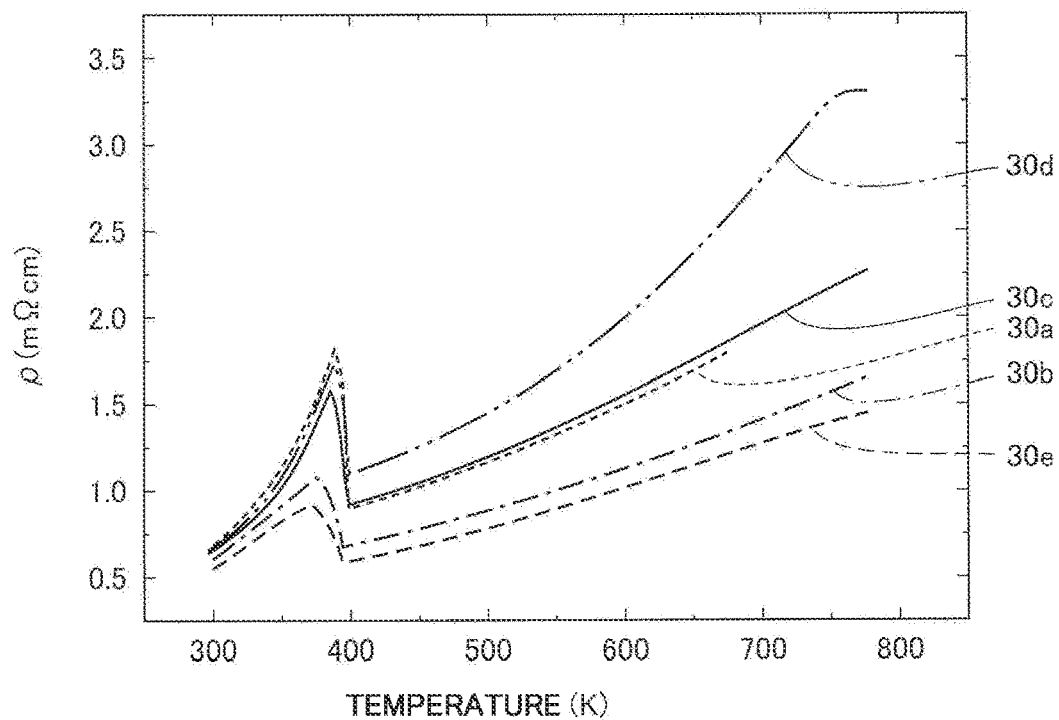
FIG. 5 is a graph showing a relation between a resistivity and a temperature.
Figure 6:
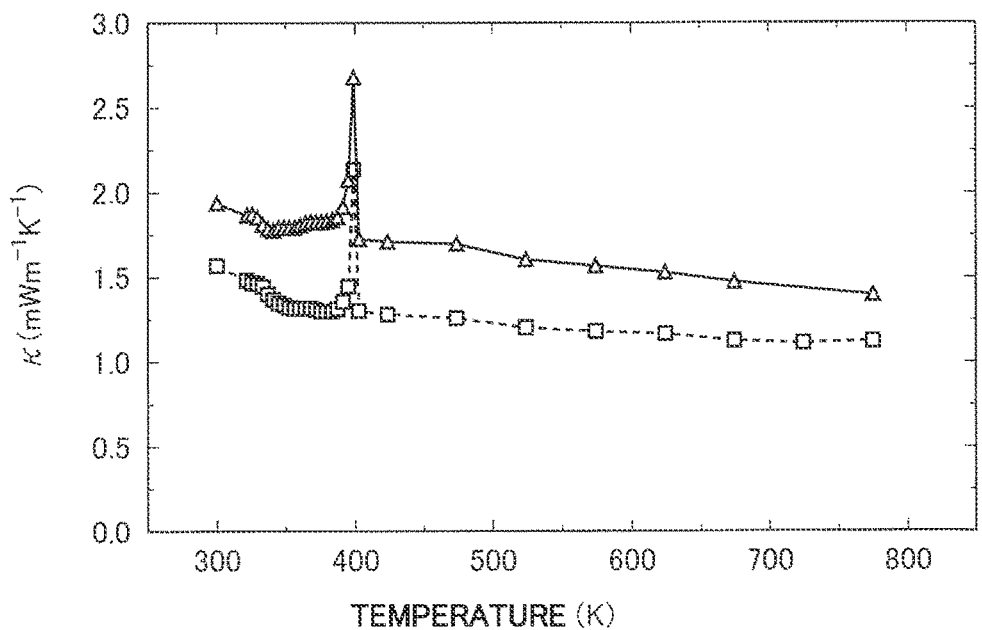
FIG. 6 is a graph showing a relation between a thermal conductivity and a temperature.

It should be noted that resistivity ρ and thermal conductivity κ of thermoelectric material portion 31 were measured. FIG. 5 is a graph showing a relation between the resistivity and the temperature. In FIG. 5, the vertical axis represents resistivity p ($m\Omega \cdot cm$) and the horizontal axis represents the temperature (K). In FIG. 5, a line 30a represents a case of x=0 (case where no Ni is added), a line 30b represents a case of x=0.005, a line 30c represents a case of x=0.01, a line 30d represents a case of x=0.02, and a line 30e represents a case of x=0.03. In the cases of line 30a to line 30e, tendencies of resistivity ρ are the same. FIG. 6 is a graph showing a relation between the thermal conductivity and the temperature. In FIG. 6, the vertical axis represents thermal conductivity κ ($mWm^{-1}K^{-1}$), and the horizontal axis represents the temperature (K). In FIG. 6, a quadrangular mark represents a case of x=0 (case where no Ni is added), and a triangle mark represents a case of x=0.005. In the cases of x=0 and x=0.005, tendencies of thermal conductivity κ are the same.

First, with reference to FIG. 5, resistivity ρ is increased in a temperature range of about 300 K to about 380 K; however, at about 345 K at which the Seebeck coefficient shown in FIG. 4 is changed from a positive value to a negative value, resistivity ρ is not particularly greatly varied. That is, it is considered that the electric conductivity represented by the reciprocal of resistivity ρ is not varied. Moreover, with reference to FIG. 6, thermal conductivity κ is decreased gradually in a temperature range of about 300 K to about 400 K; however, at about 345 K at which the Seebeck coefficient shown in FIG. 4 is changed from a positive value to a negative value, thermal conductivity κ is not particularly greatly varied. Therefore, in the temperature region in which Seebeck coefficient α is increased, there is not found any other parameter that decreases ZT.

Therefore, according to such a thermoelectric material element 11, the thermoelectric efficiency can be improved using high Seebeck coefficient α.

Figure 7:
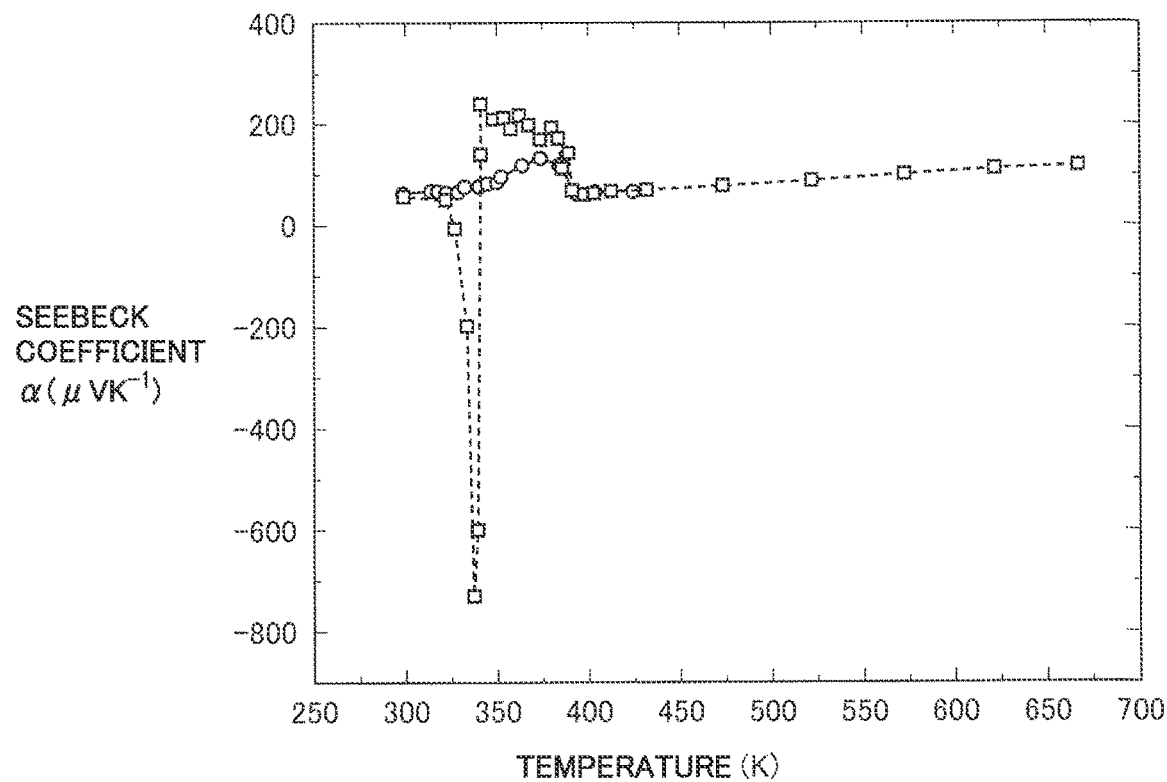
FIG. 7 is a graph showing a relation between the Seebeck coefficient and temperature of the thermoelectric material portion.

It should be noted that the Seebeck coefficient under a reduced pressure is as follows. FIG. 7 is a graph showing a relation between the temperature and the Seebeck coefficient in each of a case of an atmospheric pressure (1013 hPa) and a case of vacuum ($1 \times 10^{-2}$ to $1 \times 10^{-4}$ Pa). In FIG. 7, the vertical axis represents Seebeck coefficient α ($\mu VK^{-1}$) and the horizontal axis represents the temperature (K). Each circle mark represents the case of atmospheric pressure, and each quadrangular mark represents the case of vacuum.

With reference to FIG. 7, in the case of the atmospheric pressure, the Seebeck coefficient is increased gradually from about 350 K, and indicates $+150$ $\mu VK^{-1}$ at about 380 K. Then, when the temperature is increased, the Seebeck coefficient becomes close to 0. In the case of vacuum, the Seebeck coefficient is decreased from about 325 K and indicates $-750$ $\mu VK^{-1}$ at about 340 K. Then, when the temperature is increased, the Seebeck coefficient is increased to change from a negative value to a positive value, and becomes more than 250 $\mu VK^{-1}$ at about 350 K.

In the case where the temperature environment is 330 K, Seebeck coefficient α is 70 $\mu VK^{-1}$ when the pressure of atmosphere is 10 Pa. When the pressure of atmosphere is decreased from 10 Pa, Seebeck coefficient α is decreased greatly to change from a positive value to a negative value. Also when the pressure of atmosphere becomes $1\times10^{-4}$ Pa by decreasing the pressure of atmosphere, Seebeck coefficient α indicates a value of $-750$ $\mu VK^{-1}$.

In the case where the temperature environment is 380 K, when the pressure of atmosphere is $1\times10^{-4}$ Pa, Seebeck coefficient α has a large value of 180 $\mu VK^{-1}$. When used as a p type thermoelectric material, this value leads to ZT having a large value of about 7. When the pressure of atmosphere is increased from 10 Pa, Seebeck coefficient α becomes about 100 $\mu VK^{-1}$.

It should be noted that one factor for attaining high Seebeck coefficient α in this way in the above-described configuration is considered to be occurrence of the following phenomenon.

It is considered that due to the phase transformation, the two different phases coexist to result in different chemical potentials (Fermi levels), whereby carriers are diffused from the second crystal phase to the first crystal phase. Accordingly, the carrier concentration in the second crystal phase during the operation (i.e., the phase transformation) becomes lower than the carrier concentration in the second crystal phase before the operation. Accordingly, it is considered that the high Seebeck coefficient can be obtained.

This carrier concentration, i.e., resistance can be measured using a scanning spread resistance microscope (SSRM), for example.

Figure 8:
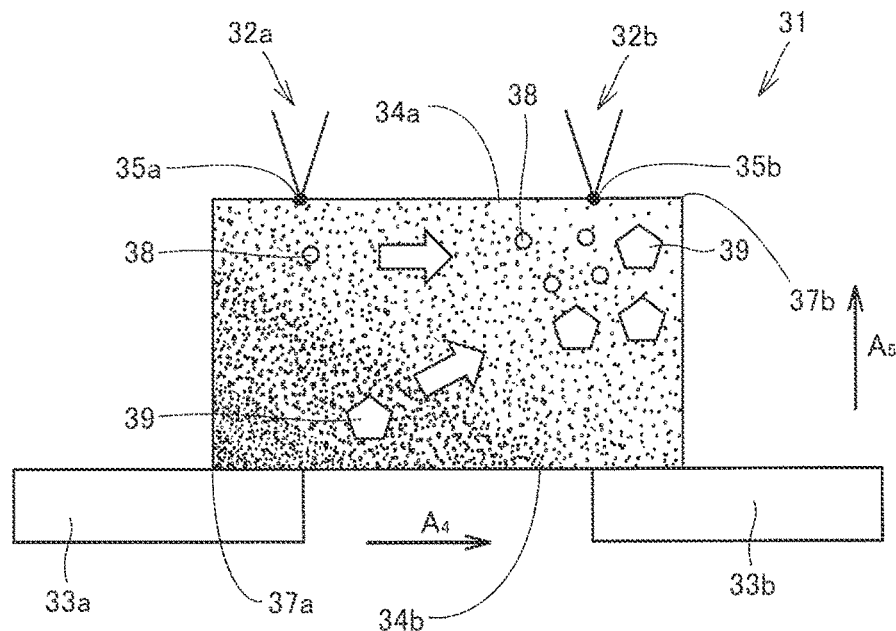
FIG. 8 conceptually shows a diffusion state of carriers in the thermoelectric material portion shown in FIG. 3.

Moreover, another factor for attaining high Seebeck coefficient α in the above-described configuration is considered to be occurrence of the following phenomenon. FIG. 8 conceptually shows a diffusion state of carriers and the like in thermoelectric material portion 31 shown in FIG. 3. In order to facilitate understanding, carriers 38 and composite defects 39 are illustrated schematically in FIG. 8.

With reference to FIG. 8, the temperature in thermoelectric material portion 31 has a two-axis inclination in the direction indicated by arrow $A_4$ and the direction indicated by arrow $A_5$. During the phase transformation, not only diffusion of carriers 38 in thermoelectric material portion 31 takes place but also diffusion of vacancies or interstitial atoms having electric charges such as ions or diffusion of composite defects 39 of the vacancies and interstitial atoms, atomic displacement, and the like take place. That is, carriers 38, composite defects 39 and the like are diffused in directions indicated by white arrows in FIG. 8. As a result, it is considered that a potential difference becomes large between first thermocouple 32a and second thermocouple 32b to greatly change Seebeck coefficient α.

Figure 9:
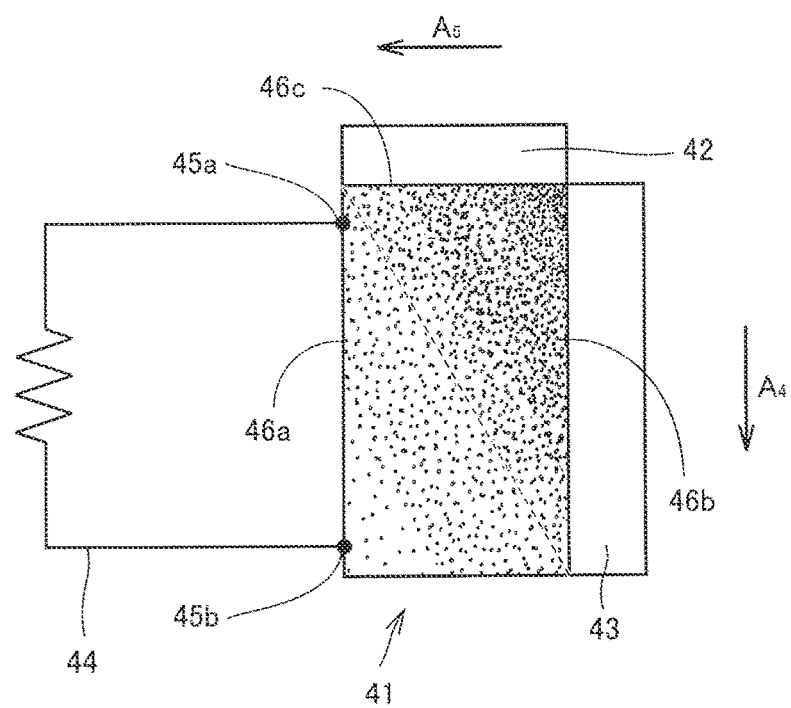
FIG. 9 shows a state in which a first heater and a second heater are disposed in a different manner.

It should be noted that the temperature difference may be formed by disposing heaters as follows. FIG. 9 shows a state in which a first heater and a second heater are disposed in a different manner. With reference to FIG. 9, a thermoelectric material portion 41 has a rectangular shape in a cross section shown in FIG. 9. A first heater 42 on the high temperature side, a second heater 43 on the low temperature side, and a wiring 44 are attached to thermoelectric material portion 41. Wiring 44 is attached in contact with thermoelectric material portion 41 at each of a first point 45a and a second point 45b. Here, second heater 43 is attached thereto in contact with a surface 46b that is not in contact with a surface 46a having first point 45a and second point 45b. Moreover, first heater 42 is attached thereto in contact with a surface 46c that crosses both surface 46a and surface 46b. With such a configuration, a temperature difference can be formed in a direction indicated by an arrow $A_4$ and a direction indicated by an arrow $A_5$.

Figure 10:
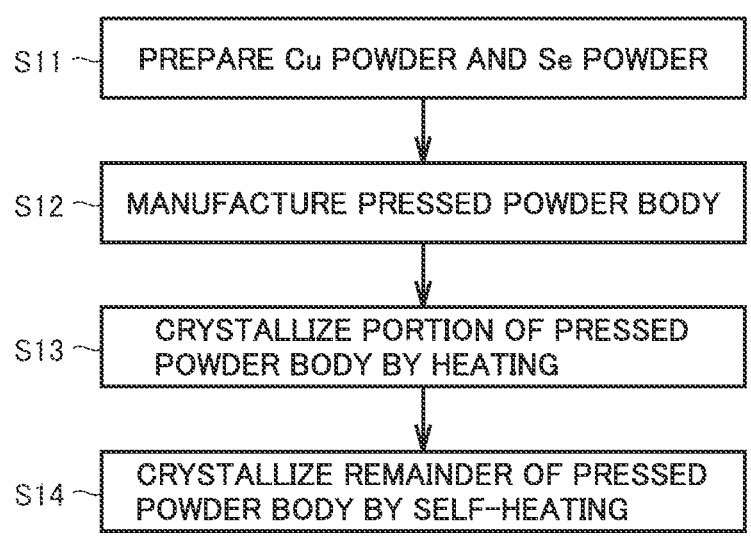
FIG. 10 is a flowchart showing representative steps in a method for manufacturing a thermoelectric material.

Next, the following describes an exemplary method for manufacturing the above-described thermoelectric material element. In the method for manufacturing the thermoelectric material element, the thermoelectric material of which thermoelectric material portion 31 is composed is first manufactured in the following steps. FIG. 10 is a flowchart showing representative steps in the method for manufacturing the thermoelectric material. With reference to FIG. 10, the method for manufacturing the thermoelectric material includes the steps of: obtaining a pressed powder body by solidifying powder serving as a source material of a chalcogenide; crystallizing a portion of the pressed powder body by heating; and crystallizing a remainder of the pressed powder body by self-heating of the pressed powder body with the heating being halted after crystallizing the portion of the pressed powder body, the self-heating of the pressed powder body resulting from progress of crystallization.

Specifically, first, Cu powder and Se powder are prepared (step S11 in FIG. 10; the term "step" will be omitted in the description below). The Cu powder is the powder serving as the source material of the chalcogenide, and the Se powder is also the powder serving as the source material of the chalcogenide. Then, these are mixed, pressed and solidified into a pressed powder body in the form of a pellet (S12). It should be noted that Ni powder, Ti powder, and/or Zr powder, each of which is the powder serving as the source material of the chalcogenide, may be added as required. Next, a portion of the pressed powder body obtained in the form of a pellet is heated to be crystallized (S13).

The heating of the portion of the pressed powder body is performed within a chamber having a reduced pressure and having a heater, for example. A degree of vacuum in the chamber is set to, for example, about $1\times10^{-4}$ Pa, and the pressed powder body is heated for about 1 second using the heater. When a changing point is reached, the portion of the pressed powder body is crystallized. Then, the heating is halted after crystallizing the portion of the pressed powder body. In this case, crystallization is promoted by self-heating without performing heating again. That is, the remainder of the pressed powder body is crystallized by self-heating of the pressed powder body, the self-heating of the pressed powder body resulting from progress of crystallization (S14). In this way, there is manufactured the thermoelectric material of which the thermoelectric material portion is composed. The first electrode and the second electrode are attached to the obtained thermoelectric material portion, thereby manufacturing the thermoelectric material element.

Second Embodiment

Figure 11:
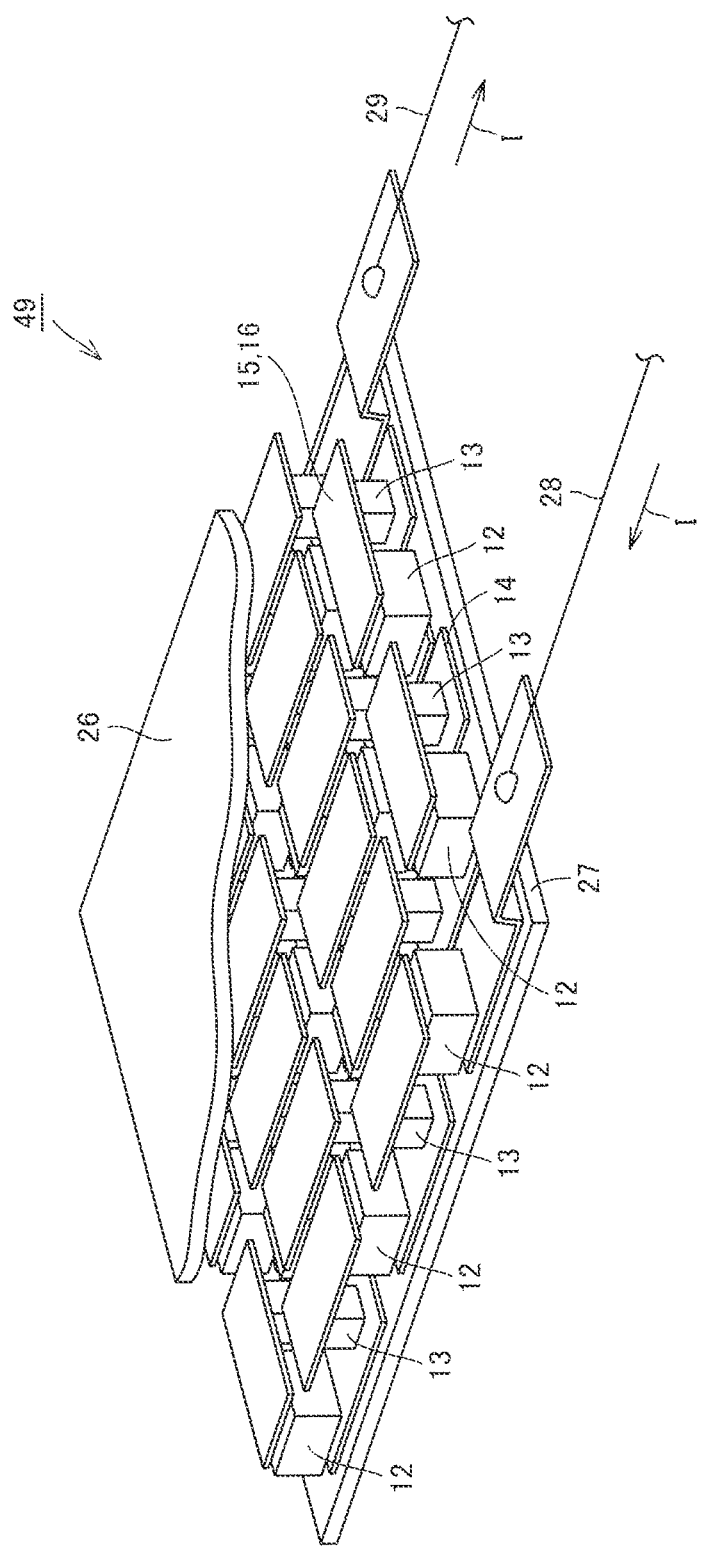
FIG. 11 shows an exemplary structure of a power generation module according to another embodiment of the present application.

It should be noted that the following configuration may be employed. FIG. 11 shows an exemplary structure of a power generation module 49 according to another embodiment of the present application. With reference to FIG. 11, power generation module 49 of the present embodiment includes: thermoelectric material portions 12; metal wires 13; low temperature side electrodes 15, 16 corresponding to first low temperature side electrodes 15 and second low temperature side electrodes 16; high temperature side electrodes 14; a low temperature side insulator substrate 26; and a high temperature side insulator substrate 27. Each thermoelectric material portion 12 and each metal wire 13 have respectively the same configurations as those of thermoelectric material portion 12 and metal wire 13 included in I type thermoelectric material element 11. Each of low temperature side insulator substrate 26 and high temperature side insulator substrate 27 is composed of a ceramic such as alumina. Thermoelectric material portions 12 and metal wires 13 are disposed side by side alternately. As with I type thermoelectric material element 11, low temperature side electrodes 15, 16 are disposed in contact with corresponding thermoelectric material portions 12 and metal wires 13. As with I type thermoelectric material element 11, high temperature side electrodes 14 are disposed in contact with corresponding thermoelectric material portions 12 and metal wires 13. Each thermoelectric material portion 12 is connected to an adjacent metal wire 13 on one side by a common high temperature side electrode 14. Moreover, each thermoelectric material portion 12 is connected to an adjacent metal wire 13 on a side different from the one side by common low temperature side electrodes 15, 16. Thus, all the thermoelectric material portions 12 and metal wires 13 are connected in series.

Low temperature side insulator substrate 26 is disposed on the main surface side of each of low temperature side electrodes 15, 16 that are each in the form of a plate, the main surface side being opposite to the side thereof in contact with thermoelectric material portion 12 and metal wire 13. One low temperature side insulator substrate 26 is disposed for the plurality of (all the) low temperature side electrodes 15, 16.

High temperature side insulator substrate 27 is disposed on the main surface side of each of high temperature side electrodes 14 that are each in the form of a plate, the main surface side being opposite to the side thereof in contact with thermoelectric material portion 12 and metal wire 13. One high temperature side insulator substrate 27 is disposed for the plurality of (all the) high temperature side electrodes 14.

Wirings 28, 29 are connected to high temperature side electrodes 14 or low temperature side electrodes 15, 16, which are in contact with thermoelectric material portions 12 or metal wires 13 located at both ends among thermoelectric material portions 12 and metal wires 13 connected in series. When a temperature difference is formed to attain a high temperature on the high temperature side insulator substrate 27 side and a low temperature on the low temperature side insulator substrate 26 side, current flows in a direction of arrow I by thermoelectric material portions 12 and metal wires 13 connected in series, as with I type thermoelectric material element 11. In this way, power generation by thermoelectric conversion using the temperature difference is attained in power generation module 49.

In this case, for thermoelectric material portions 12 and metal wires 13, the efficiency in thermoelectric conversion can be increased by causing crystal phase transformation during the operation and employing a high Seebeck coefficient during the crystal phase transformation. Therefore, such a power generation module 49 can provide improved efficiency in thermoelectric conversion.

Third Embodiment

Figure 12:
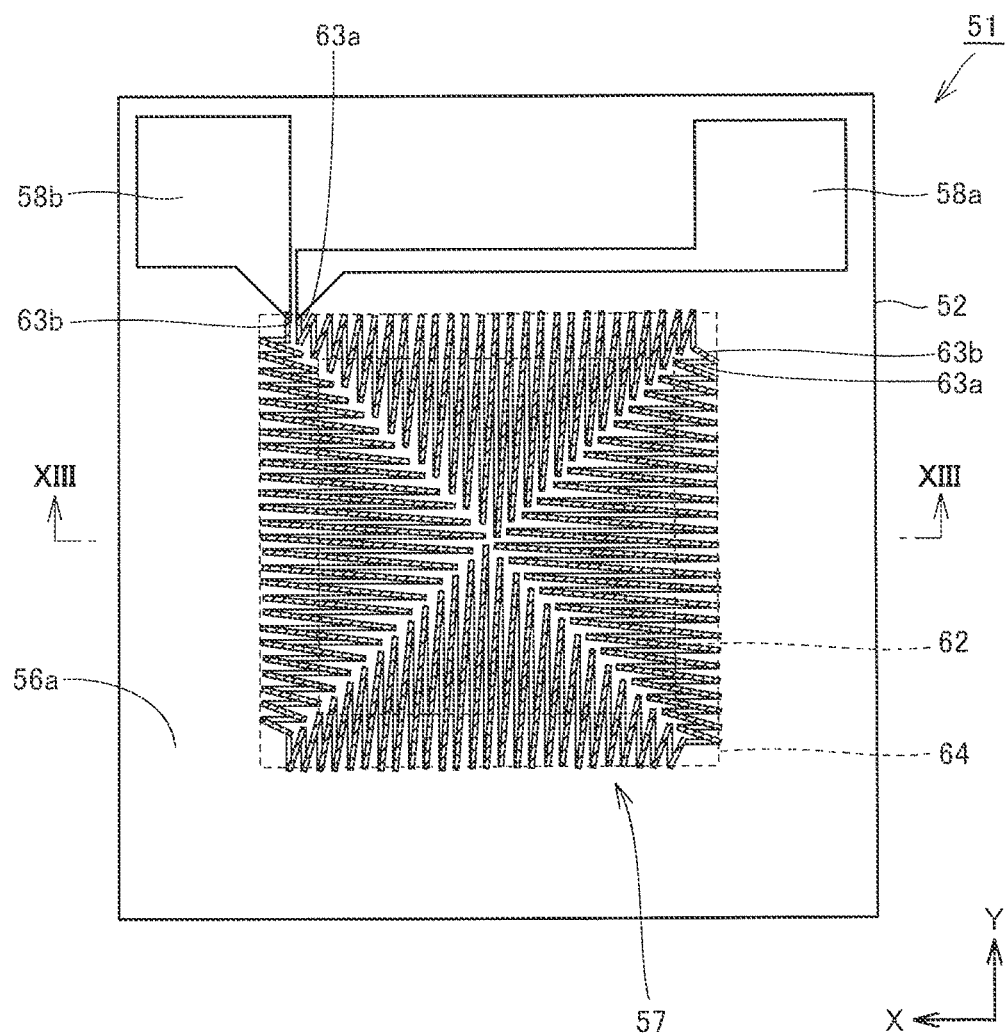
FIG. 12 shows an infrared sensor when viewed in a plan.
Figure 13:
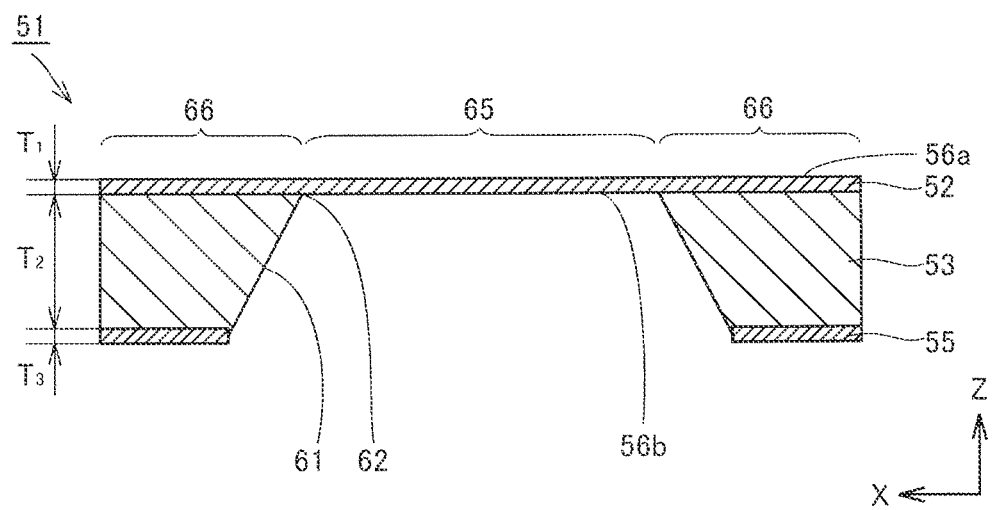
FIG. 13 is a cross sectional view of a region indicated by XIII-XIII in FIG. 12.
Figure 14:
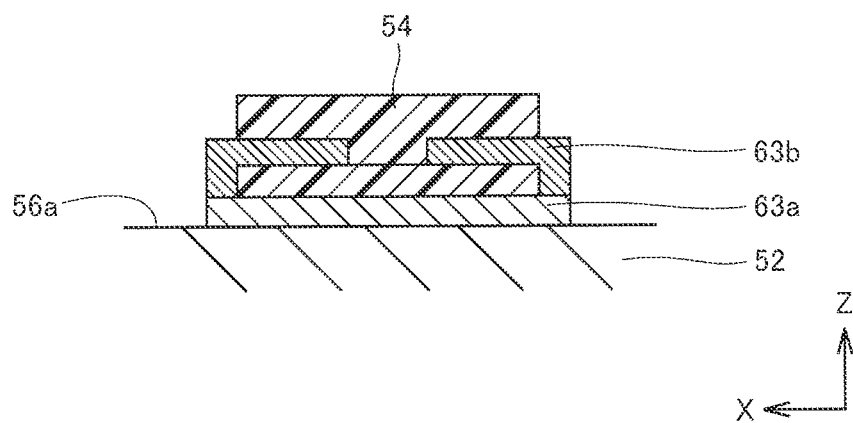
FIG. 14 is an enlarged cross sectional view showing a cross section of a contact portion between the thermoelectric material portion and a metal wire in the infrared sensor.

Next, the following describes a configuration of an infrared sensor serving as an optical sensor using the thermoelectric material element according to still another embodiment of the present application. Each of FIG. 12, FIG. 13, and FIG. 14 shows a configuration of an infrared sensor 51. FIG. 12 shows the infrared sensor when viewed in a plan. FIG. 13 is a cross sectional view of a region indicated by XIII-XIII in FIG. 12. FIG. 14 is an enlarged cross sectional view of a cross section of a contact portion between a thermoelectric material portion and a metal wire in the infrared sensor.

With reference to FIG. 12, FIG. 13, and FIG. 14, infrared sensor 51 includes a base layer 52 in the form of a plate, a thick portion 53, an infrared absorption portion 54 (particularly, see FIG. 14), a protective film 55, and a thermoelectric material element 57. Base layer 52 is constituted of a $SiO_2/SiN/SiO_2$ film. That is, base layer 52 has a configuration obtained by layering $SiO_2$, SiN, and $SiO_2$. Base layer 52 has a thickness $T_1$ of about 1.1 µm. Base layer 52 is configured to have a rectangular shape when viewed in a plan in the Z axis direction, i.e., the thickness direction of base layer 52. Specifically, base layer 52 is configured to have a slightly longer length in the X axis direction than a length in the Y axis direction. Thermoelectric material element 57 is provided on one main surface 56a of base layer 52 in the thickness direction. A first pad electrode 58a and a second pad electrode 58b are provided on one main surface 56a of base layer 52 in the thickness direction. First pad electrode 58a serves as a first electrode and second pad electrode 58b serves as a second electrode in thermoelectric material element 57. By first pad electrode 58a and second pad electrode 58b, voltage is output as an output of infrared sensor 51. Examples of a material of each of first pad electrode 58a and second pad electrode 58b include gold (Au), titanium (Ti), platinum (Pt), and the like.

Thick portion 53 is composed of Si. Thick portion 53 is provided along an outer edge of base layer 52. Thick portion 53 is provided at a location other than a central region when base layer 52 is viewed in a plan. The central region corresponds to a region internal to a below-described boundary 62 indicated by a broken line. Thick portion 53 is formed by so-called anisotropic wet etching, a wall surface 61 of thick portion 53 on the internal side has a tapered shape with a wide opening. Boundary 62 with the other main surface 56b of base layer 52 has a rectangular shape, and is indicated by a broken line in FIG. 12.

Protective film 55 is provided on thick portion 53 at a side opposite, in the thickness direction of base layer 52, to the location at which base layer 52 is disposed. Protective film 55 has a thickness $T_3$ that is as large as thickness $T_1$. Thick portion 53 has a thickness $T_2$ sufficiently thicker than thickness $T_1$ and thickness $T_3$.

Thermoelectric material element 57 includes thermoelectric material portions 63a and metal wires 63b. Each of thermoelectric material portions 63a is composed of the thermoelectric material including the first crystal phase and the second crystal phase different from the first crystal phase during an operation, i.e., use of infrared sensor 51. Specifically, thermoelectric material portion 63a is constituted of a Cu2Se thin film. Each of metal wires 63b is constituted of a Bi thin film.

Thermoelectric material portion 63a and metal wire 63b are configured as a pair. Thermoelectric material element 57 is provided with 100 pairs of thermoelectric material portions 63a and metal wires 63b in total. The 100 pairs of thermoelectric material portions 63a and metal wires 63b are provided to be substantially contained in a square-shaped region 64 provided at the central region of base layer 52 on main surface 56a when viewed in a plan in the Z axis direction. The central region is indicated by the broken line. Thermoelectric material portions 63a are provided on main surface 56a, with a space being interposed therebetween, straightly along a direction indicated by the X axis or a direction indicated by the Y axis. Each of metal wires 63b is provided to be inclined relative to the direction indicated by the X axis, so as to connect an internal side end portion of one of adjacent thermoelectric material portions 63a to an external side end portion of the other of adjacent thermoelectric material portions 63a. In this case, metal wires 63b are also provided with a space being interposed therebetween. Thermoelectric material portions 63a and metal wires 63b are disposed to be connected to each other alternately. In this case, the 100 pairs of thermoelectric material portions 63a and metal wires 63b are connected in series. It should be noted that first pad electrode 58a is connected to a thermoelectric material portion 63a located closest to the end portion among the 100 pairs of thermoelectric material portions 63a and metal wires 63b in series. Second pad electrode 58b is connected to a metal wire 63b located closest to the end portion among the 100 pairs of thermoelectric material portions 63a and metal wires 63b in series. It should be noted that metal wire 63b connected to second pad electrode 58b is configured to extend straightly in the X axis direction. It should be noted that when viewed in a plan, each of thermoelectric material portions 63a and metal wires 63b has a width of less than or equal to 5 μm.

Next, the following describes a configuration of a contact portion between thermoelectric material portion 63a and metal wire 63b. With reference to FIG. 14 mainly, thermoelectric material portion 63a is disposed on main surface 56a. Thermoelectric material portion 63a has a thickness of less than or equal to 0.2 μm. Infrared absorption portion 54 and metal wire 63b are formed on thermoelectric material portion 63a. Metal wire 63b has the thinnest portion having a thickness of less than or equal to 0.2 μm. Infrared absorption portion 54 is composed of $SiO_2$.

Infrared absorption portion 54 also functions as an insulation portion for insulating between thermoelectric material portion 63a and metal wire 63b. Metal wires 63b are provided in contact with the both ends of thermoelectric material portion 63a such that infrared absorption portion 54 is disposed at the central portion thereof. Infrared absorption portion 54 is also formed on metal wires 63b. It should be noted that in region 64, infrared absorption portion 54 is provided on and covers thermoelectric material portion 63a and metal wire 63b; however, in order to facilitate understanding, infrared absorption portion 54 is not illustrated in FIG. 12 and FIG. 13.

In infrared sensor 51 having such a configuration, the thickness of internal side region 65 of base layer 52 is configured to be thinner than the thickness of external side region 66 of base layer 52. It should be noted that the thickness of region 65 is indicated by thickness $T_1$, and the thickness of region 66 is preferably larger than thickness $T_1$. This is due to the following reason. That is, with such a configuration, infrared rays irradiated with region 65 is converted into heat and the heat is likely to be accumulated, thus obtaining a high-sensitivity sensor. In internal side region 65, a portion of thermoelectric material element 57 located at the internal side is disposed.

The following describes an exemplary operation of infrared sensor 51 having such a configuration. In infrared sensor 51, a heater is disposed on the protective film 55 side for the purpose of heating. An adjustment is made to attain a temperature for the operation of infrared sensor 51.

Then, when irradiated with infrared rays from the main surface 56a side, the following phenomenon takes place. That is, since infrared absorption portion 54 is provided within region 64 in infrared sensor 51, parts of thermoelectric material portions 63a and metal wires 63b in internal side region 65 have a relatively high temperature, thereby forming a first temperature region. On the other hand, parts of thermoelectric material portions 63a and metal wires 63b in external side region 66 have a relatively low temperature due to thick portion 53 exhibiting a function of heat sink, thereby forming a second temperature region. In other words, in this case, the first temperature region is formed at the parts disposed in internal side region 65, and the second temperature region is formed at the parts disposed in external side region 66. For thermoelectric material portions 63a, the ratio of the first crystal phase to the second crystal phase in the first temperature region is larger than the ratio of the first crystal phase to the second crystal phase in the second temperature region. Therefore, the efficiency in thermoelectric conversion can be increased by causing crystal phase transformation during the operation, i.e., during the operation of infrared sensor 51, and employing a high Seebeck coefficient during the crystal phase transformation. In this case, voltages output by first pad electrode 58a and second pad electrode 58b are amplified by the 100 pairs of thermoelectric material portions 63a and metal wires 63b. Therefore, infrared sensor 51 can have a high sensitivity.

Moreover, infrared sensor 51 may be used with the following temperature environment being provided thereto. That is, in infrared sensor 51, a heater is disposed on the protective film 55 side for the purpose of heating. An adjustment is made to attain a temperature for the operation of infrared sensor 51. In this case, heat is transferred from thick portion 53 to result in a relatively high temperature at the parts of thermoelectric material portions 63a and metal wires 63b in external side region 66, thereby forming the first temperature region. In other words, in this case, the second temperature region is formed at the parts disposed in internal side region 65, and the first temperature region is formed at the parts disposed in external side region 66. For thermoelectric material portions 63a, the ratio of the first crystal phase to the second crystal phase in the first temperature region is larger than the ratio of the first crystal phase to the second crystal phase in the second temperature region. Therefore, the efficiency in thermoelectric conversion can be increased by causing crystal phase transformation during the operation, i.e., during the use of infrared sensor 51, and employing a high Seebeck coefficient during the crystal phase transformation. In this case, voltages output by first pad electrode 58a and second pad electrode 58b are amplified by the 100 pairs of thermoelectric material portions 63a and metal wires 63b. Therefore, infrared sensor 51 can have a high sensitivity.

It should be noted that in the above-described embodiment, a plurality of infrared sensors 51 may be arranged. In this case, one row of infrared sensors 51 may be disposed in one direction or infrared sensors 51 may be two-dimensionally disposed in the form of a matrix.

The operation described above corresponds to the transition region in the phase transformation of the material with the two crystal phases coexisting. In view of the temperature, the operation corresponds to the temperature range in which the phase transformation takes place. For example, in the case of $Cu_2Se$, the temperature range is 325 K to 400 K.

Moreover, in the above-described embodiment, the thermoelectric material is manufactured through the steps shown in FIG. 10; however, it is not limited thereto. The thermoelectric material may be manufactured by a different method.

It should be noted that in the above-described embodiment, the first crystal phase is a cubic crystal and the second crystal phase is a monoclinic crystal; however, they are not limited thereto. The first crystal phase and the second crystal phase may have other crystal structures. Further, the thermoelectric material may be configured to include a different third crystal phase.

In the above-described embodiment, the thermoelectric material element is disposed in a vacuum environment ($1\times10^{-2}$ to $1\times10^{-4}$ Pa); however, it is not limited thereto. In order to provide a heat insulation effect, the thermoelectric material element may be operated in an atmosphere including a material with the heat insulation effect, rather than in vacuum. Examples of the atmosphere in which the thermoelectric material element is disposed may include sulfur dioxide gas, chlorine gas, propane gas, krypton gas, xenon gas, argon gas, acetylene gas, ethylene gas, perlite, and the like, each of which has a thermal conductivity smaller than that of air.

Moreover, in the above-described embodiment, the thermoelectric material element is disposed in a vacuum environment ($1\times10^{-2}$ to $1\times10^{-4}$ Pa); however, it is not limited thereto. The environment may be an environment having an atmosphere in which vacancies can be generated. For example, the environment may be an environment having an atmosphere in which the vapor pressure of the material is higher than that of air. Specifically, for example, a surface of the material of the thermoelectric material portion may be coated with Ni, Ti, $SiO_2$, or amorphous Si. Even when there is such a coating layer, the thermoelectric material can react with, for example, Ni to promote generation of vacancies in the thermoelectric material.

The thermoelectric material element, the power generation device, the optical sensor, and the method for manufacturing the thermoelectric material in the present application can be applied particularly advantageously when high efficiency in thermoelectric conversion is required.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 11, 57: thermoelectric material element; 12, 31, 41, 63a: thermoelectric material portion; 13, 63b: metal wire; 14: high temperature side electrode; 15, 16: low temperature side electrode; 17, 28, 29, 44: wiring; 18a, 36a: first temperature region; 18b, 36b: second temperature region; 19: coating material; 21, 22, 23, 24: end portion; 25a, 62: boundary; 25b, 37a: maximum temperature portion; 25c, 37b: minimum temperature portion; 26, 27: insulator substrate; 30a, 30b, 30c, 30d, 30e: line; 32a, 32b: thermocouple; 33a, 33b, 42, 43: heater; 34a, 34b, 46a, 46b, 46c: surface; 35a, 35b, 45a, 45b: point; 38: carrier; 39: composite defect; 49: power generation module; 51: infrared sensor; 52: base layer; 53: thick portion; 54: infrared absorption portion; 55: protective film; 56a, 56b: main surface; 58a, 58b: pad electrode; 61: wall surface; 64, 65, 66: region.

The invention claimed is:

1. A thermoelectric material element comprising:
a thermoelectric material portion composed of a thermoelectric material that is configured to include a first crystal phase and a second crystal phase within a part of a temperature range of 50° C. to 600° C., the second crystal phase being different from the first crystal phase;
a first electrode disposed in contact with the thermoelectric material portion; and
a second electrode disposed in contact with the thermoelectric material portion and disposed to be separated from the first electrode, wherein
the thermoelectric material portion is configured to be heated to a temperature within the part of the temperature range of 50° C. to 600° C. such that the thermoelectric material portion includes:
a first temperature region having a first temperature, and
a second temperature region having a second temperature lower than the first temperature of the first temperature region, and
a ratio of the first crystal phase to the second crystal phase in the first temperature region is larger than a ratio of the first crystal phase to the second crystal phase in the second temperature region.

2. The thermoelectric material element according to claim 1, wherein
the first temperature region includes a maximum temperature portion having a highest temperature,
the second temperature region includes a minimum temperature portion having a lowest temperature, and
the ratio of the first crystal phase to the second crystal phase becomes smaller from the maximum temperature portion toward the minimum temperature portion.

3. The thermoelectric material element according to claim 2, wherein the thermoelectric material portion is configured such that, within the part of the temperature range of 50° C. to 600° C., a direction from the maximum temperature portion toward the minimum temperature portion is inclined relative to a direction from a region at which the first electrode and the thermoelectric material portion are in contact with each other toward a region at which the second electrode and the thermoelectric material portion are in contact with each other.

4. The thermoelectric material element according to claim 1, wherein in a compound of which the thermoelectric material portion is composed, a ratio of cation atoms included in the first crystal phase is different from a ratio of cation atoms included in the second crystal phase.

5. The thermoelectric material element according to claim 1, wherein the thermoelectric material is configured to have a carrier concentration in the second crystal phase within the part of the temperature range of 50° C. to 600° C. that is lower than a carrier concentration in the second crystal phase in a state at a temperature of 25° C.

6. The thermoelectric material element according to claim 1, wherein at least a portion of a surface of the thermoelectric material portion is configured to be thermally insulated under a reduced pressure.

7. The thermoelectric material element according to claim 6, wherein the reduced pressure is an atmospheric pressure of less than 10 Pa.

8. The thermoelectric material element according to claim 1, wherein the thermoelectric material portion is configured such that, within the part of the temperature range of 50° C. to 600° C., a temperature difference is less than 2 K between a region at which the first electrode and the thermoelectric material portion are in contact with each other and a region at which the second electrode and the thermoelectric material portion are in contact with each other.

9. The thermoelectric material element according to claim 1, wherein the thermoelectric material portion is composed of a chalcogenide.

10. The thermoelectric material element according to claim 1, wherein the thermoelectric material portion is composed of $Cu_2Se$, $SnSe$, $Ag_2Se$, $Ag_2Te$, or a compound obtained by adding a transition metal element to one of the Cu$_2$Se, the SnSe, the Ag$_2$Se, the Ag$_2$Te.

11. The thermoelectric material element according to claim 10, wherein
the thermoelectric material portion is composed of a compound obtained by adding Ni, Ti, or Zr to the Cu$_2$Se.

12. The thermoelectric material element according to claim 10, wherein the thermoelectric material portion is composed of a compound obtained by adding Sc, Ti, or Zr to the SnSe.

13. The thermoelectric material element according to claim 1, wherein
the thermoelectric material portion is composed of Cu$_2$Se, and the thermoelectric material portion is configured to include the first crystal phase and the second crystal phase within a temperature range of 50° C. to 130° C.

14. The thermoelectric material element according to claim 1, wherein
the thermoelectric material portion is composed of SnSe, and
the thermoelectric material portion is configured to include the first crystal phase and the second crystal phase within a temperature range of 130° C. to 530° C.

15. The thermoelectric material element according to claim 1, wherein the first crystal phase is a cubic or orthorhombic crystal.

16. A power generation device comprising the thermoelectric material element recited in claim 1.

17. An optical sensor comprising the thermoelectric material element recited in claim 1.

18. A thermoelectric material element comprising:
a thermoelectric material portion composed of a thermoelectric material that is configured to include a first crystal phase and a second crystal phase within a part of a temperature range of 50° C. to 600° C., the second crystal phase being different from the first crystal phase;
a first electrode disposed in contact with the thermoelectric material portion; and
a second electrode disposed in contact with the thermoelectric material portion and disposed to be separated from the first electrode, wherein
the thermoelectric material portion consists of Cu$_2$Se, SnSe, Ag$_2$Se, Ag$_2$Te, or a compound obtained by adding a transition metal element to one of the Cu$_2$Se, the SnSe, the Ag$_2$Se, or the Ag$_2$Te,
within the part of the temperature range of 50° C. to 600° C., the thermoelectric material portion is configured to include:
a first temperature region having a first temperature, and
a second temperature region having a second temperature lower than the first temperature of the first temperature region, and
a ratio of the first crystal phase to the second crystal phase in the first temperature region is larger than a ratio of the first crystal phase to the second crystal phase in the second temperature region.

19. A thermoelectric material element comprising:
a thermoelectric material portion composed of a thermoelectric material that is configured to include a first crystal phase and a second crystal phase within a part of a temperature range of 50° C. to 600° C., the second crystal phase being different from the first crystal phase;
a first electrode disposed in contact with the thermoelectric material portion; and
a second electrode disposed in contact with the thermoelectric material portion and disposed to be separated from the first electrode, wherein
within the part of the temperature range of 50° C. to 600° C., the thermoelectric material portion is configured to include:
a first temperature region having a first temperature, and
a second temperature region having a second temperature lower than the first temperature of the first temperature region,
a ratio of the first crystal phase to the second crystal phase in the first temperature region is larger than a ratio of the first crystal phase to the second crystal phase in the second temperature region,
the first temperature region includes a maximum temperature portion having a highest temperature,
the second temperature region includes a minimum temperature portion having a lowest temperature,
the ratio of the first crystal phase to the second crystal phase becomes smaller from the maximum temperature portion toward the minimum temperature portion, and
the thermoelectric material portion is configured such that, within the part of the temperature range of 50° C. to 600° C., a direction from the maximum temperature portion toward the minimum temperature portion is inclined relative to a direction from a region at which the first electrode and the thermoelectric material portion are in contact with each other toward a region at which the second electrode and the thermoelectric material portion are in contact with each other.

* * * * *